United States Patent [19]

Schenck

[11] Patent Number: 4,618,832
[45] Date of Patent: Oct. 21, 1986

[54] DIFFERENTIAL AMPLIFIER WITH IMPROVED POWER SUPPLY REJECTION RATIO

[75] Inventor: Stephen R. Schenck, McKinney, Tex.

[73] Assignee: Texas Instruments Incorporated, Dallas, Tex.

[21] Appl. No.: 746,212

[22] Filed: Jun. 18, 1985

[51] Int. Cl.$^4$ ............................................. H03F 3/45
[52] U.S. Cl. ................................... 330/254; 330/253
[58] Field of Search ............. 330/253, 257, 277, 288, 330/298, 149; 323/315, 316; 307/200 B

[56] References Cited

U.S. PATENT DOCUMENTS 3,851,269 11/1974 Szorc ................................... 330/149
4,384,350 5/1983 Lee et al. ......................... 307/200 B Primary Examiner—Gene Wan
Attorney, Agent, or Firm—Richard A. Bachand; N. Rhys Merrett; Melvin Sharp

[57] ABSTRACT

An improved differential amplifier having improved immunity to signals on the power supply terminals (32,34) thereof. The low impedance path between the power supply terminals (32,34) of the amplifier and the second gain stage transistor (24) is removed and connected to a low noise reference. The source of the transistor (24) is provided as an output terminal (23) of the amplifier and can be optionally connected to any low noise reference. High impedance input current mirrors (47,55,63,67) are connected between the supply voltage rails (33,35) and the amplifier, thereby further reducing the amplifier's susceptibility to noise.

1 Claim, 3 Drawing Figures

DIFFERENTIAL AMPLIFIER WITH IMPROVED POWER SUPPLY REJECTION RATIO

TECHNICAL FIELD OF THE INVENTION

The present invention relates in general to amplifiers, and more particularly relates to methods and apparatus for reducing an amplifier's susceptibility to extraneous noise and signals.

BACKGROUND OF THE INVENTION

The primary purpose of amplifiers is to faithfully reproduce only those signals applied to the input. In practice, however, extraneous signals can enter the amplifier circuit through the DC power supply, are electromagnetically induced into the amplifier circuit or are generated by the amplifier components themselves. While the noise or signal problems caused by the latter two mentioned situations can be dealt with by proper selection, placement and shielding techniques, the noise and extraneous signals arising from the power supply circuitry are more difficult to eliminate or reduce.

In many applications, amplifier demands require a high power supply rejection ratio (PSRR), especially in environments having an abundance of noise and extraneous signals. This is especially true in telephone switching circuits where digital switching equipment is interfaced with analog voice equipment to either code analog voice signals into a digital transmission format, or perform the reverse decoding operation. Notwithstanding the high noise content prevalent in the digital and analog conversion process, operational amplifiers are required to present a high immunity to such extraneous power supply signals.

An amplifier's immunity to extraneous signals becomes even more important when operating at high frequencies. As the signal frequency increases the feedback of the amplifier is unable to completely correct itself, thus the gain decreases. Near the unity gain bandwidth point, the amplitude of extraneous signals may become significant when combined with high frequency signals of reduced amplification.

One approach commonly used to increase the signal immunity on the power supply inputs of operational amplifiers is to use R-C filters connected to the positive (V+) and negative (V−) operational amplifier power supply inputs. While this approach is relatively inexpensive and easy to implement with discrete components, the solution is generally impractical in monolithic circuits as the cost of the capacitive element would be prohibitive.

Another approach previously taken to increase the noise and signal immunity of an operational amplifier is to provide a power supply for the small signal stage thereof, and another power supply for the output or drive stage. The small signals or intermediate stages of an operational amplifier are generally the high gain stages, and thus are critical stages with regard to extraneous signal immunity. However, dual power supplies are expensive and, in many applications, are also impractical to implement.

The low immunity of operational amplifier stages to extraneous signals is due in a large part to circuit design. More specifically, the major contributors to poor extraneous signal immunity are forward biased PN junctions (in bipolar circuits) and source to gate structures in MOS transistor circuits. This is especially true when such junctions and structures appear as low impedance paths between the operational amplifier circuit and the power supply inputs. Any signal or noise component within the power supply is thus easily coupled into amplifier circuitry.

From the foregoing, it may be seen that a need has arisen for an amplifier design which addresses noise and signal rejection in amplifiers without the accompanying shortcomings attendant with prior techniques.

SUMMARY OF THE INVENTION

In accordance with the invention, methods and apparatus are provided for improving the immunity or rejection of an amplifier to extraneous signals on its power supply inputs. In the disclosed embodiment, the amplifier is powered with positive and negative DC supply voltages. More specifically, the invention is directed to a Metal Oxide Semiconductor or MOS-type differential amplifier wherein the second gain stage is arranged so as to remove the MOS transistor low impedance terminal (source terminal) connection from the positive power supply input, and thereby eliminate the low impedance AC signal path from such supply to the differential amplifier.

The second gain stage of the differential amplifier is a single high gain MOS transistor amplifier with the source terminal thereof made available as an output pin of the amplifier. In the preferred form, this pin is connected to a low noise reference, such as circuit ground. To provide a quiescent operating point of the transistor substantially between the positive and negative supply voltages, the drain of the high gain transistor is coupled to a current mirror which, in turn, is in parallel with a current source. Similarly, the gate of the transistor is driven by a current mirror and a constant current source which provides a signal balanced between the positive and negative supplies. Because the reference against which the output parameters of the differential amplifier are measured is also circuit ground, such parameters are substantially improved over those of differential amplifiers heretofore known.

In addition, a number of current mirrors are utilized in the amplifier between the positive and negative power supply rails and the amplifier circuitry to provide additional isolation of such circuitry to extraneous signals.

BRIEF DESCRIPTION OF THE DRAWINGS

Further objects and features of the present invention will become apparent from the description of an illustrative embodiment thereof, taken in conjunction with the accompanying drawings, in which.

DETAILED DESCRIPTION OF THE INVENTION

Figure 1:
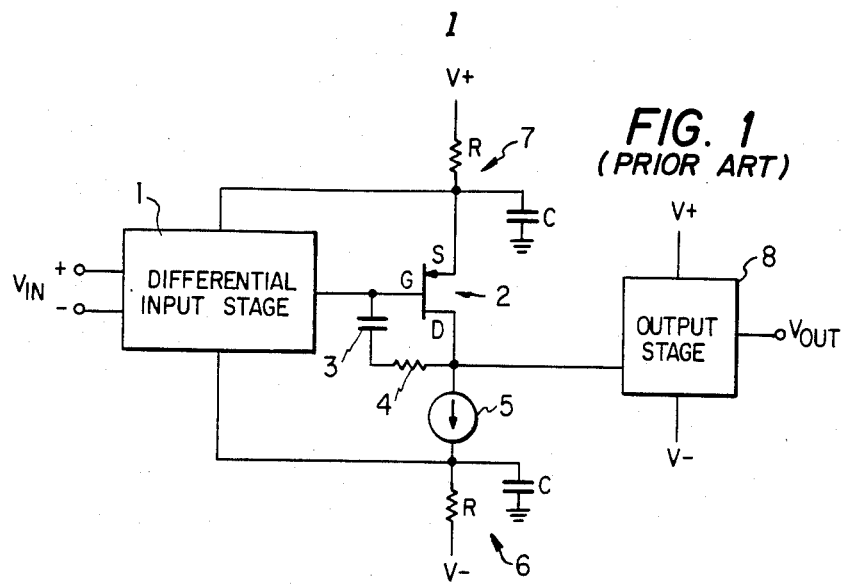
FIG. 1 illustrates a differential amplifier of the prior art generally in block diagram form, and with the second gain stage thereof shown schematically.

FIG. 1 illustrates an operational amplifier utilizing R-C filters and plural power supplies in accordance with the prior art. A differential input stage 1 receives an input signal and supplies an output to a MOS transistor 2. A feedback capacitor 3 and resistor 4 are connected across the gate and drain of transistor 2. A constant current source 5 is connected between transistor 2 and an R-C filter 6. The source of transistor 2 is connected to R-C filter 7. Typical resistive and capacitive component values of filters 6 and 7 are 100 ohms and 0.1 microfarad. Filter 6 is connected to the negative power supply terminal and filter 7 is connected to the positive power supply terminal. The output of transistor 2 is connected to the output stage 8.

While such prior circuits shown in FIG. 1 can reduce noise, they require discrete components and thus are not easily adapted to monolithic amplifier circuits.

Figure 2:
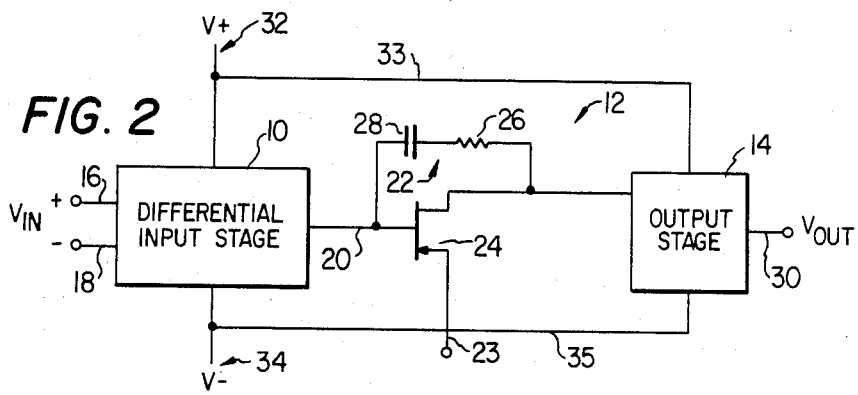
FIG. 2 illustrates a differential amplifier according to the invention, with the second gain stage shown in partial electrical schematic form.
Figure 3:
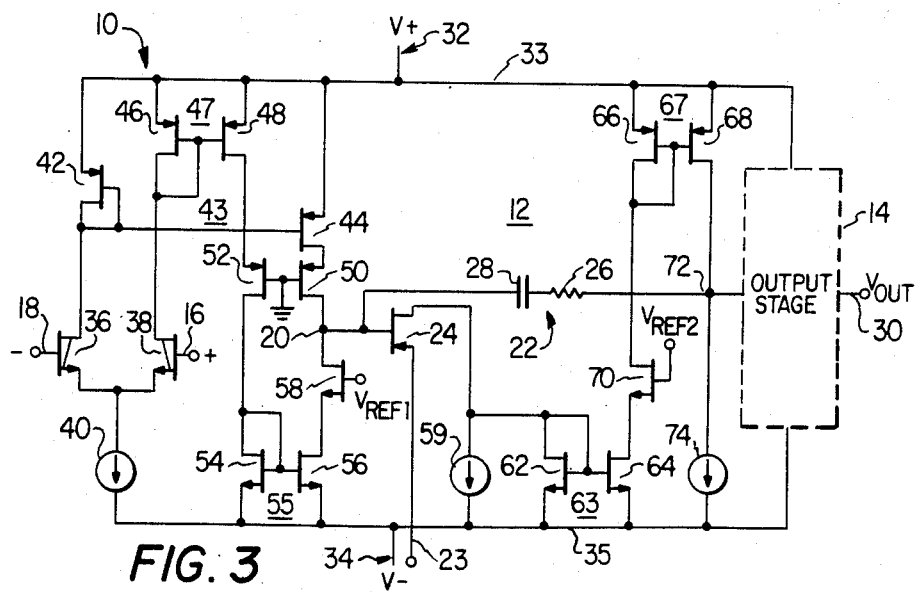
FIG. 3 is an electrical schematic illustration of the differential input stage and the second gain stage according to the invention.

The application of the present invention is best understood by referring to FIGS. 2 and 3 of the drawing. In FIG. 2 there is shown the differential amplifier according to the invention, including a differential input stage 10, a second gain stage 12, and finally an output stage 14. The differential input stage 10 is effective to amplify differential signals applied respectively to the input noninverting terminal 16, and the input inverting terminal 18. The output 20 of the differential input stage 10 is single-ended and drives the second gain stage 12.

An internal compensating network 22 is connected across a grounded source MOS transistor 24 which comprises the major amplification element of the second gain stage 12. The internal compensation network 22 includes a resistor 26 in series with a capacitor 28, the values of which are chosen to provide a desired output gain bandwidth response of the amplifier. The output stage 14 of the differential amplifier is not shown in detail, but may be constructed with conventional components by those skilled in the art to provide sufficient current at an output 30 for driving other circuits. The differential amplifier of the invention is shown connected to a single positive power supply 32, and a single negative power supply 34.

The primary function of the differential input stage 10 is to provide a single-ended output 20 representative of the difference between the signals applied to the noninverting input 16, and the inverting input 18. The differential input stage 10 is fabricated of MOS transistors, with an overall amplification factor of about one hundred. The higher gain stage of the differential amplifier is the second gain stage 12, which amplifies signals by a factor of about two hundred. These gain factors are only exemplary and may vary considerably depending on specific applications.

The primary function of the output stage 14 is not necessarily signal amplification, but rather provides a driving means for supplying sufficient power to drive loads connected to the output 30. In the illustrated differential amplifier the second gain stage 12 provides necessary amplification of the signals processed by the differential amplifier. According to the invention, the second gain stage 12 is connected so as to provide the amplifier with a low susceptibility to extraneous signals.

With reference to FIG. 3, there is shown a more detailed electrical diagram of the invention, wherein like numerals are used for like and corresponding parts shown in FIG. 2. Specifically, the differential input stage 10 is constructed with a pair of n-channel MOS transistors. It should be noted that in the description hereof, the term "transistor" denotes a MOS-type transistor constructed to operate in the enhancement mode. However, it will be understood that the present invention may be practiced with other active elements such as bipolar transistors. Input transistors 36 and 38 are connected to receive the input signals applied to terminals 16 and 18. Each input transistor 36 and 38 preferably has undergone a process during fabrication such that the gate threshold voltage (Vt) required to turn the devices on is very small, on the order of several hundred millivolts. The sources of input transistors 36 and 38 are connected together and to a constant current source 40. The constant current source 40, in turn, is connected to the negative power supply voltage 34.

The drain of transistor 36 is connected to the drain of p-channel transistor 42, which in turn is connected to a p-channel transistor 44. Transistors 42 and 44 are connected together as a current mirror 43 such that the drain current of transistor 42 is mirrored by the drain current of p-channel transistor 44. The noted current mirror is constructed by tying the gate and drain terminals of transistor 42 together, as well as tying the gates of transistors 42 and 44 together. In addition, the conditions under which transistors 42 and 44 are fabricated are very closely controlled such that the transistors have substantially identical characteristic curves. The sources of each mirror circuit transistor 42 and 44 are connected to the positive supply voltage 32.

It is to be noted in FIG. 3 that all circuit connections from the power supply rails 33 and 35 to the amplifier circuitry are through current mirrors and current sources. This aspect of the invention permits the necessary MOS transistor source terminal connections to the power supply rails 33 and 35 without the attendant low impedance concerns. It is known in the art that when transistors are connected in a current mirror configuration such as shown by 47, signal voltage variations on the source terminals are not significantly reproduced on the drain terminals thereof. However, signals on the gate terminals are reproduced on the drain terminals. Thus, the current mirrors employed in the invention are ideally suited for low power supply rejection ratio applications. The constant current sources shown in FIG. 3 are of conventional design, and present a high impedance between the negative power supply rail 35 and the differential amplifier circuitry.

Continuing with the circuit arrangement of FIG. 3, the drain of input transistor 38 is connected to a current mirror 47 comprising p-channel transistors 46 and 48. The drain current of transistor 46 is mirrored by the drain current of transistor 48. The current mirror 47 is fabricated with a gain such that the drain current of transistor 48 is the same as that of transistor 46.

It can be seen that the drain currents of mirror circuit transistors 44 and 48 are respective representations of voltages at differential inputs 18 and 16. The drain terminals of mirror transistors 44 and 48 are connected respectively to the source terminals of transistors 50 and 52. The gates of transistors 50 and 52 are both connected to circuit ground. The drain of transistor 52 is connected to the drain of n-channel transistor 54, which transistor is connected to associated n-channel transistor 56 to form a current mirror circuit 55. In other words, the gate of transistor 54 is connected to the drain thereof, as well as to the gate of transistor 56.

The sources of transistors 54 and 56 are connected together to the negative power supply 34. In this manner, the drain current of transistor 54 is mirrored by that of transistor 56. The drain terminal of a n-channel transistor 58 is connected to the drain terminal of transistor 50, while the source terminal of transistor 58 is connected to the drain terminal of transistor 56. The gate terminal of transistor 58 is connected to a voltage reference VREF1 which provides a constant voltage to the gate of such transistor.

Node 20 is the single-ended output of the differential input stage 10. Accordingly, the signal at node 20 is representative of the composite of signals applied to the differential input terminals 16 and 18. It is seen that because the constant current source 40 is connected to the sources of input transistors 36 and 38, transistor 44 includes components of current as a result of signals on both inputs 16 and 18. Similarly, transistor 56 also includes components of current of signals on both inputs 16 and 18. It is thus noted from the circuit of FIG. 3 that the composite drain current of transistor 50 is composed of currents associated with signals applied to the inverting input terminal 18, as well as signals applied to the noniverting input terminal 16. As a result, the voltage at node 20 is the single-ended voltage output of the differential input stage 10.

It is also to be noted that the output signal of the differential input stage 10 at node 20 is symmetrical. Transistors 44 and 50 are cascoded above node 20, while transistors 56 and 58 are cascoded below such node. Moreover, the voltage VREF1 is selected so as to bias transistor 58 in such a manner as to establish a drain-source voltage such that the voltage swing of signals at node 20 are symmetrical with respect to both the positive power supply 32 and negative power supply 34.

In accordance with the invention, the signals applied to the second gain stage 12 at node 20 have undergone a nominal amplification. Additional gain in the exemplary amplifier occurs within the second gain stage 12, which stage therefore must be addressed with regard to extraneous signals. To that end, there is provided as part of the second gain stage 12 a p-channel transistor 24 with the gate thereof connected to node 20. The source of transistor 24 is provided as an output pin 23, while the drain terminal is connected to a current mirror 63, comprised of transistors 62 and 64. The drain current of transistor 24 flows through current mirror transistor 62, which current is mirrored by transistor 64, also with a nominal gain. Drain current of transistor 24 also flows through current source 59, connected in parallel with mirror 63. The drain terminal of transistor 64 is, in turn, connected to another current mirror 67, comprising transistors 66 and 68, through intermediate transistor 70.

The gate of transistor 70 is connected to a reference voltage VREF2 so as to aid in balancing the voltage swing at the output of the second gain stage at node 72. The drain current of transistor 66 is mirrored with a nominal gain by transistor 68. The output node 72 of the second gain stage 12 is the interconnection of multiple elements, namely, the drain of transistor 68, a constant current source 74, the output stage 14, and the internal compensation feedback network 22 comprising resistor 26 and capacitor 28.

Constant current source 74 aids in establishing a quiescent operating point at output node 72 at a voltage level intermediate the positive power supply 32 voltage and negative power supply 34 voltage. In the illustrated embodiment of the invention, an output stage 14 provides the current drive capability for driving a load connected to the output terminal 30. In some applications, the output stage 14 may be dispensed with altogether in which event the second gain stage 12 may be connected directly to a load. Such a load may be a high impedance load and thus not require a large drive. The gain between the current mirror transistors 66 and 68 is also nominal. It is seen that the overall effect of the various nominal gains of the second gain stage 12 may be substantial.

Because any extraneous signal which may enter the second gain stage will undergo appreciable amplification, it is necessary to reduce the second gain stage's susceptibility to extraneous signals. Accordingly, and contrary to former practices, the high gain transistor 24 of the second gain stage 12 has been connected so as to eliminate a low impedance AC path between either the positive power supply 32 or the negative power supply 34. Instead, the source of transistor 24 is provided as an external pin 23 so as to be referenced to a low noise point, rather than to either of the power supplies 32 or 34. It is recognized that the source terminal of a MOS transistor is a low impedance input to the device. It is contemplated that in most applications the output pin 23, and thus the source of transistor 24, will be connected to circuit ground. This is logical as the power supply rejection ratio parameter is generally measured with respect to ground. In any event, the advantage of the invention is best realized when pin 23 is connected to the same reference point to which the measured parameter is referenced.

In the embodiment of FIG. 3, the low impedance source terminal of transistor 24 is referenced, and thus susceptible, only to noise or extraneous signals appearing on pin 23. However, if pin 23 is grounded, and since the circuit ground bus is generally free of undesired signals, such a ground referencing of transistor 24 is preferable to power supply referencing. Moreover, circuit measurements at the output 30, such as noise, distortion, etc., are generally made with respect to circuit ground and, therefore, any common mode extraneous signals existing at transistor 24 and at the output 30 are of reduced significance. In equivalent bipolar circuits, transistor 24 would be of a grounded emitter configuration, thus referencing the low impedance terminals thereof to circuit ground.

It can be readily appreciated that with the provision of the transistor 24 source appearing as an output pin 23, the connection thereof to a source of low noise can be chosen at any time. Therefore, the design of the amplifier itself need not be predicated upon anticipated applications. Rather, the connection of pin 23 to a reference is left as an option to satisfy many anticipated, and unanticipated, applications.

Because the differential input stage 10 and the current mirror circuitry of the second gain stage 12 have been designed to operate mid-way between the voltages of power supplies 32 and 34, transistor 24 may operate in the grounded source mode. The noted combination permits the second gain stage 12 to amplify signals symmetrically about a quiescent operating point to upper amplitudes approaching the voltage of the positive power supply 32, and to lower amplitudes approaching the negative power supply 34 voltage.

It is seen from the foregoing that an amplifier has been provided which has a high rejection to extraneous signals appearing on the power supply inputs. This is achieved by removing the low impedance paths between the power supplies and the amplifier circuitry, especially in the second gain stage of the amplifier. In MOS circuits, such as the type described above, the low impedance source connection has been removed from the positive power supply, and is referenced instead to ground. Those skilled in the art may prefer to connect pin 23 to a stable, low noise power supply, not being one of the V+ or V− supplies. Other DC power connections of the circuitry are made to the power supplies by current sources and current mirrors to thereby even further increase circuit immunity to undesired signals on the power supplies. Such techniques may be utilized in bipolar circuits to realize similar advantages.

Therefore, while the preferred embodiment of the methods and apparatus have been disclosed with reference to a specific amplifier circuit, it is to be understood that many changes in detail may be made as a matter of engineering choices without departing from the scope of the invention as defined by the appended claims.

What is claimed is:

1. A differential amplifier having improved immunity to signals on the power supply inputs thereof, comprising:

an input differential stage including first and second transistors coupled to the inputs of said amplifier, first and second current mirrors each connected respectively between one of the power supply inputs and said first and second transistors, and a current source connecting said first and second transistors to the other power supply input;

a gain stage having a MOS transistor with a source input, current mirror means connected to the output of said MOS transistor and to the power supply inputs for providing an output voltage with upper and lower limits corresponding substantially to the voltages on said power supply inputs;

an amplifier output terminal connected to the source input of said MOS transistor for referencing said MOS transistor to desired low noise references; and means for connecting said input differential stage to said MOS transistor for driving said MOS transistor with a differential signal about a predetermined circuit potential.

* * * * *